(12) United States Patent
Nilsson

(10) Patent No.: US 10,423,489 B2
(45) Date of Patent: Sep. 24, 2019

(54) DATA INTEGRITY DETECTION AND CORRECTION

(71) Applicant: Zebware AB, Stockholm (SE)

(72) Inventor: Thomas Nilsson, Meilen (CH)

(73) Assignee: Zebware AB, Stockholm (SE)

( * ) Notice: Subject to any disclaimer, the term of this patent is extended or adjusted under 35 U.S.C. 154(b) by 0 days.

(21) Appl. No.: 15/748,928

(22) PCT Filed: Jul. 28, 2016

(86) PCT No.: PCT/SE2016/050732
§ 371 (c)(1),
(2) Date: Jan. 30, 2018

(87) PCT Pub. No.: WO2017/023199
PCT Pub. Date: Feb. 9, 2017

(65) Prior Publication Data
US 2018/0246784 A1    Aug. 30, 2018

Related U.S. Application Data

(60) Provisional application No. 62/199,617, filed on Jul. 31, 2015.

(51) Int. Cl.
*H03M 13/00* (2006.01)
*G06F 11/10* (2006.01)
(Continued)

(52) U.S. Cl.
CPC ........ *G06F 11/1076* (2013.01); *G06F 17/147* (2013.01); *H03M 13/07* (2013.01);
(Continued)

(58) Field of Classification Search
CPC .. G06F 11/1076; G06F 17/147; H03M 13/07; H03M 13/373; H03M 13/2906
See application file for complete search history.

(56) References Cited

U.S. PATENT DOCUMENTS

2017/0048551 A1\* 2/2017 Evenou .................. H04N 19/60

OTHER PUBLICATIONS

International Search Report dated Sep. 14, 2016 in PCT/SE2016/050732, citing documents AT through AV therein, 4 pages.
(Continued)

*Primary Examiner* — Samir W Rizk
(74) *Attorney, Agent, or Firm* — Oblon, McClelland, Maier & Neustadt, L.L.P.

(57) ABSTRACT

The proposed technology provides methods, devices and computer programs for performing data error detection and correction. It is provided a method for performing data error detection and correction. The method comprises the step S1 of providing multiple Mojette transform projections (pi,q,) obtained by applying an encoding Mojette transform on an input, or original, block of data elements or values. The method also comprises decoding S2 the multiple Mojette transform projections to form a reconstructed block of data elements or values. The method also comprises investigating S3 whether any of the decoded Mojette transform projections comprises at least one bin≠0 following generation of the reconstructed block, thus providing an indication that a data error has been detected in the reconstructed block. The method also comprises determining S4, if at least one bin≠0, a corrected reconstructed block of data elements or values based on the decoded Mojette transform projections. The proposed technology also provides devices and computer programs implementing the method.

16 Claims, 12 Drawing Sheets

(51) Int. Cl.
    *H03M 13/07* (2006.01)
    *H03M 13/37* (2006.01)
    *G06F 17/14* (2006.01)
    *H03M 13/29* (2006.01)

(52) U.S. Cl.
    CPC ..... *H03M 13/2906* (2013.01); *H03M 13/373* (2013.01); *G06F 2211/1028* (2013.01)

(56) References Cited

OTHER PUBLICATIONS

Serfözö, P., et al., "Performance Requirements of the Mojette Transform for Internet Distributed Databases and Image Processing", Optimization of Electrical and Electronic Equipment, 2008, pp. 87-92.
Normand, N., et al., "Erasure Coding with the Finite Radon Transform", IEEE Wireless Communication and Networking Conference, 2010, pp. 1-6.
Guedon, J.P., et al., "Spline Mojette Transform. Applications in Tomography and Communications", Signal Processing Conference, 2002, pp. 1-4.
Verbert, P., et al., "Analysis of Mojette Transform Projections for an Efficient Coding", Workshop on Image Analysis for Multimedia Interactive Services, 2004, pp. 1-4 with cover page.
Normand, N., et al., "A Geometry Driven Reconstruction Algorithm for the Mojette Transform", Discrete Geometry for Computer Imagery, Oct. 2006, vol. 4245, pp. 122-133 with cover pages.
"Data Integrity", CERN/IT, Apr. 8, 2007, pp. 1-7.
Bairavasundaram, L.N., et al. "An Analysis of Data Corruption in the Storage Stack", FAST'08: $6^{th}$ USENIX Conference on File and Storage Technologies, 2008, pp. 223-238.
Extended European Search Report dated Dec. 19, 2018 in European Patent Application No. 16833404.3, citing documents AU through AZ therein, 13 pages.
Pertin, D., et al., "Performance evaluation of the Mojette erasure code for fault-tolerant distributed hot data storage", ARXIV.org, Cornell University Library, XP080808751, Apr. 27. 2015, pp. 1-5.
Wu, J., et al., "Redundant Transformation on the Binary Data and Its Applications to Image Coding and Transmission", IEEE Asia-Pacific Conference on Circuits and Systems 2000, XP010537725, Dec. 2000, pp. 763-766.
Parrein, B., et al., "Multimedia Forward Error Correcting codes for wireless LAN", Annales Des Telecommunications, XP001170095, vol. 58 No. 3/04, Mar. 1, 2003, pp. 448-463.
Guédon, J.P., et al., "Internet Distributed Image Information System", Integrated Computer-Aided Engineering, vol. 8 No. 3, XP001157068, Mar. 2000, pp. 205-214.
Pertin, D., et al., "Distributed File System Based on Erasure Coding for I/O-Intensive Applications", $4^{th}$ International Conference on Cloud Computing and Services Science,XP055528595, Apr. 3, 2014, pp. 451-456.

* cited by examiner

| p(0,1) | 18 | 8 | 10 | 13 | 20 | 15 |  |  |
|---|---|---|---|---|---|---|---|---|
| p(-1,1) | 7 | 13 | 5 | 7 | 19 | 22 | 8 | 3 |
| p(1,1) | 2 | 12 | 13 | 14 | 11 | 11 | 13 | 8 |
| p(-2,1) | 7 | 4 | 11 | 2 | 14 | 16 | 12 | 11 | 4 | 3 |
| p(2,1) | 2 | 3 | 14 | 8 | 14 | 12 | 9 | 5 | 9 | 8 |

Fig 2-3

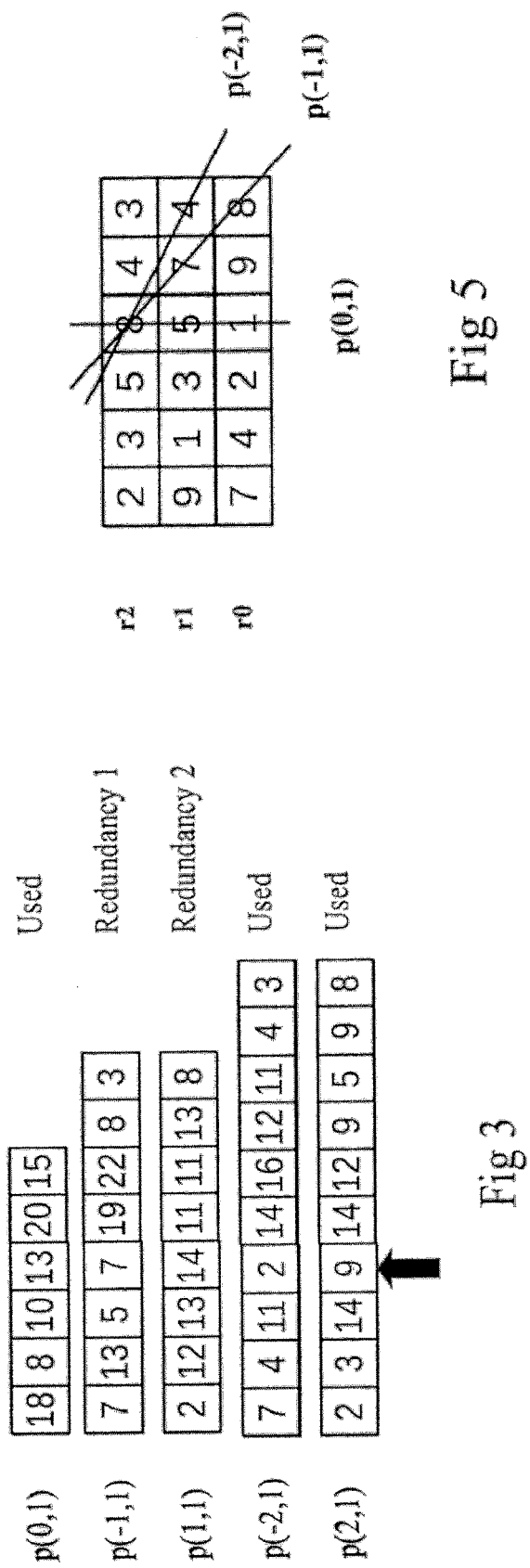

| | | | | | | | | | | | |
|---|---|---|---|---|---|---|---|---|---|---|---|
| P(-2,1) | | 7 | 4 | 11 | 2 | 14 | 16 | 12 | 11 | 4 | 3 |
| S1 | | 0 | 4 | 11 | 2 | 14 | 16 | 12 | 11 | 4 | 3 |
| S2 | | 0 | 0 | 11 | 2 | 14 | 16 | 12 | 11 | 4 | 3 |
| S3 | | 0 | 0 | 11 | 2 | 14 | 16 | 12 | 11 | 0 | 3 |
| S4 | | 0 | 0 | 11 | 2 | 14 | 16 | 12 | 11 | 0 | 0 |
| P(2,1) | | 2 | 3 | 14 | 9 | 14 | 12 | 9 | 5 | 9 | 8 |
| S5 | | 0 | 3 | 14 | 9 | 14 | 12 | 9 | 5 | 9 | 8 |
| S6 | | 0 | 0 | 14 | 9 | 14 | 12 | 9 | 5 | 9 | 8 |
| S7 | | 0 | 0 | 14 | 9 | 14 | 12 | 9 | 5 | 0 | 8 |
| S8 | | 0 | 0 | 14 | 9 | 14 | 12 | 9 | 5 | 0 | 0 |
| P(0,1) | | 18 | 8 | 10 | 13 | 20 | 15 | | | | |
| S9 | | 0 | 8 | 10 | 13 | 20 | 15 | | | | |
| S10 | | 0 | 0 | 10 | 13 | 20 | 15 | | | | |
| S11 | | 0 | 0 | 10 | 13 | 0 | 15 | | | | |
| S11 | | 0 | 0 | 10 | 13 | 0 | 0 | | | | |
| P(2,1) | S12 | 0 | 0 | 0 | 9 | 14 | 12 | 9 | 5 | 0 | 0 |
| P(2,1) | S13 | 0 | 0 | 0 | 0 | 14 | 12 | 9 | 5 | 0 | 0 |
| P(2,1) | S14 | 0 | 0 | 0 | 0 | 0 | 12 | 9 | 5 | 0 | 0 |
| P(2,1) | S15 | 0 | 0 | 0 | 0 | 0 | 0 | 9 | 5 | 0 | 0 |
| P(2,1) | S16 | 0 | 0 | 0 | 0 | 0 | 0 | 0 | 5 | 0 | 0 |
| P(2,1) | S17 | 0 | 0 | 0 | 0 | 0 | 0 | 0 | 0 | 0 | 0 |
| P(-2,1) | S18 | 0 | 0 | 0 | 0 | 0 | 0 | 0 | -1 | 0 | 0 |
| P(0,1) | S19 | 0 | 0 | 0 | -1 | 0 | 0 | | | | |
| P(-1,1) | S20 | 0 | 0 | 0 | 0 | 0 | -1 | 0 | 0 | | |

- ♦ Finished (S9–S17)
- ♦ DEADC (S18)
- ♦ DEADC (S19)
- ♦ DEADC (S20)

| 2 | 3 | 5 | 8 | 4 | 3 |
|---|---|---|---|---|---|
| 9 | 1 | 3 | 5 | 7 | 4 |
| 7 | 4 | 2 | 1 | 9 | 8 |

Fig 4

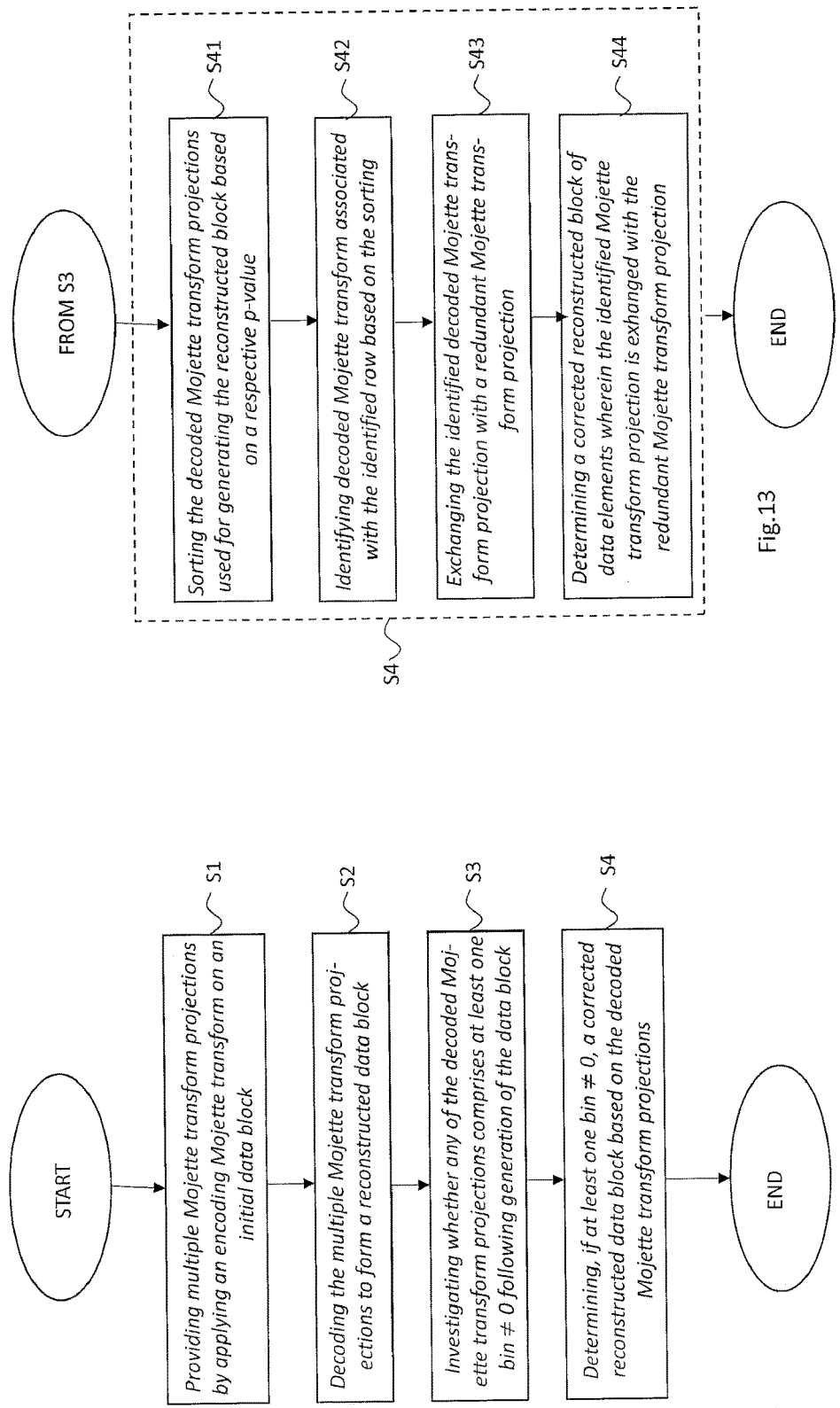

DATA INTEGRITY DETECTION AND CORRECTION

TECHNICAL FIELD

The proposed technology generally relate to data error detection and correction, and in particular to data error detection and correction for use in high efficient data transfer and/or data storage. More specifically it relates to a data error detection and correction method and corresponding devices and computer programs.

BACKGROUND

Data corruption in storage environments can have many different causes, such as hardware, network, disks, environmental, radiation, electrical, software and more, all leading to a data error in client applications. In today's data environment where more and more focus is on distributed data and applications, this problem moves from more secure data centers (DCs) to small Internet of Things (IoT) devices and Internet. To mitigate problems with data errors, DCs replicate the data over several DC sites to have copies of the data available at all times. However, replicating copies of data creates time gaps between the data copies and multiplies the amount of data and also creates a lot of extra work for the DCs to maintain all the data.

The introduction of Forward Error Correction (FEC) codes greatly improved this situation in DCs for the handling of Redundant Array of Inexpensive Discs (RAID). However, the present Reed-Solomon FEC code and similar FEC codes are not well suited for distributed storage handling tomorrow's needs for widely distributed storage.

There is a great need for a high performance FEC code with built in Data Error detection And Data error Correction (DEADC) adapted for widely distributed storage solutions achieving end-to-end data integrity.

The paper David Fiala, Frank Mueller, Christina Engelmann, Rolf Riesen, Kurt Ferreira, Ron Brightwell, Detection and Correction of Silent Data Corruption for Large-Scale High-Performance Computing, SC '12 Proceedings of the International Conference on High Performance Computing, Networking, Storage and Analysis, Article No. 78 discusses that faults have become the norm for high-end computing clusters. The paper further discloses that even a single error can have profound effects on applications by causing a cascading pattern of corruption, which in most cases spread to other processes.

The proposed technology aims to at least mitigate some of the problem related to data corruption.

SUMMARY

The embodiments teach a technology for creating a high performance, high availability, distributed storage using a novel FEC code with built in error detection and correction based on a Mojette transform, which is a discrete and exact version of the Radon transform. The present disclosure also describes how to introduce the FEC code for DC implementations as well as for widely distributed storage networks, such as IoT and Cloud Storage, and how error detection and correction is included in the data transform.

It is an object of the proposed technology to provide improved data error detection and correction.

It is also an object to provide methods for data error detection and correction.

It is also an, object to provide devices configured to perform data error detection and correction.

Still another object is to provide corresponding computer programs and computer program carriers.

According to a first aspect there is provided a method for performing data error detection and correction. The method comprises the step of providing multiple Mojette transform projections $(p_i, q_i)$ obtained by applying a Mojette transform on an input, or original, block of data elements or values. The method also comprises the step of decoding the multiple Mojette transform projections to form a reconstructed block of data elements or values and decoded Mojette transform projections. The method also comprises the step of investigating whether any of the decoded Mojette transform projections comprises at least one bin≠0 following generation of said reconstructed block, thus providing an indication that a data error has been detected in the reconstructed block. The method also comprises the step of determining S4, if at least one bin≠0, a corrected reconstructed block of data elements or values based on the decoded Mojette transform projections According to a second aspect there is provided a device configured to perform data error detection and correction. The device is configured to provide multiple Mojette transform projections $(p_i, q_i)$ obtained by applying a Mojette transform on an input, or original, block of data elements or values. The device is also configured to decode the multiple Mojette transform projections to form a reconstructed block of data elements or values and decoded Mojette transform projections. The device is also configured to investigate whether any of said decoded Mojette transform projections comprises at least one bin≠0 following generation of the reconstructed block, thus providing an indication that a data error has been detected in the reconstructed block. The device 220 is configured to determine, if at least one bin≠0, a corrected reconstructed block of data elements or values based on the decoded Mojette transform projections.

According to a third aspect there is provided a distributed object storage system. The object storage system comprises a plurality of storage servers configured to store Mojette transform projections $(p_i, q_i)$ obtained by applying a Mojette transform on an input, or original, block of data elements or values. The object storage system also comprises a storage consuming client configured to support communication over network interfaces. The storage consuming client comprises a device according to the second aspect and a plurality of communication nodes for distributing a specific one of the Mojette transform projections $(p_i, q_i)$ to a specific storage server.

According to fourth aspect there is provided a computer program comprising instructions, which when executed by at least one processor, cause the at least one processor to:
read multiple Mojette transform projections $(p_i, q_i)$ obtained by applying a Mojette transform on an input, or original, block of data elements or values;
decode the multiple Mojette transform projections to form a reconstructed block of data elements or values and decoded Mojette transform projections;
investigate whether any of the decoded Mojette transform projections comprises at least one bin≠0 following generation of the reconstructed block, thus providing an indication that a data error has been detected in the reconstructed block; and
determine, if at least one bin≠0, a corrected reconstructed block of data elements or values based on the decoded Mojette transform projections.

According to a fifth aspect there is provided a computer program product comprising the computer program of the fourth aspect.

Embodiments of the proposed technology provides a mechanism that enables secure error detection and error correction of data, particularly of data intended for distributed data storage. The proposed mechanism also ensure a reduction of the computational demands on the Central Processing Unit, CPU, of a client communicating with the data storage. Further advantages of the various embodiments will be appreciated upon reading the detailed description

BRIEF DESCRIPTION OF THE DRAWINGS

FIG. 2-1 is a first illustration for an example of Mojette transform encoding of a block of three rows with six pixels in each row into Mojette transform projections p(0,1), p(−1,1), p(1,1), p(−2,1), p(2,1).

FIG. 2-2 is a second illustration for the example of Mojette transform encoding of a block of three rows with six pixels in each row into Mojette transform projections p(0,1), p(−1,1), p(1,1), p(−2,1), p(2,1).

FIG. 2-3 is a third illustration for the example of Mojette transform encoding of a block of three rows with six pixels in each row into Mojette transform projections p(0,1), p(−1,1), p(1,1), p(2,1).

FIG. 3 presents the example in FIGS. 2-1, 2-2, and 2-3 with an error introduced in projection p(2,1) as indicated with an arrow targeting the bin, for exemplifying and showing the DEADC functionality.

FIG. 4 presents full decoding of the block using the projections p(−2,1), p(2,1), p(0,1) and having p(2,1) with an error from FIG. 3. The decoding comprises reconstructing or recalculating the block from the projections. The decoding path is then saved as a template for the next decoding using the same projections if no error occurs. The reconstructed block is shown in at the bottom of FIG. 4.

FIG. 5 shows the projections from FIG. 4 having bin(s)≠0 in a graphical way pointing out the pixel(s) introducing the error and the associated row in the reconstructed block.

FIG. 12 is a schematic flow diagram illustrating a method according to the proposed technology.

FIG. 13 is a schematic flow diagram illustrating a particular embodiment of the method according to the proposed technology.

DETAILED DESCRIPTION

Figure 1:
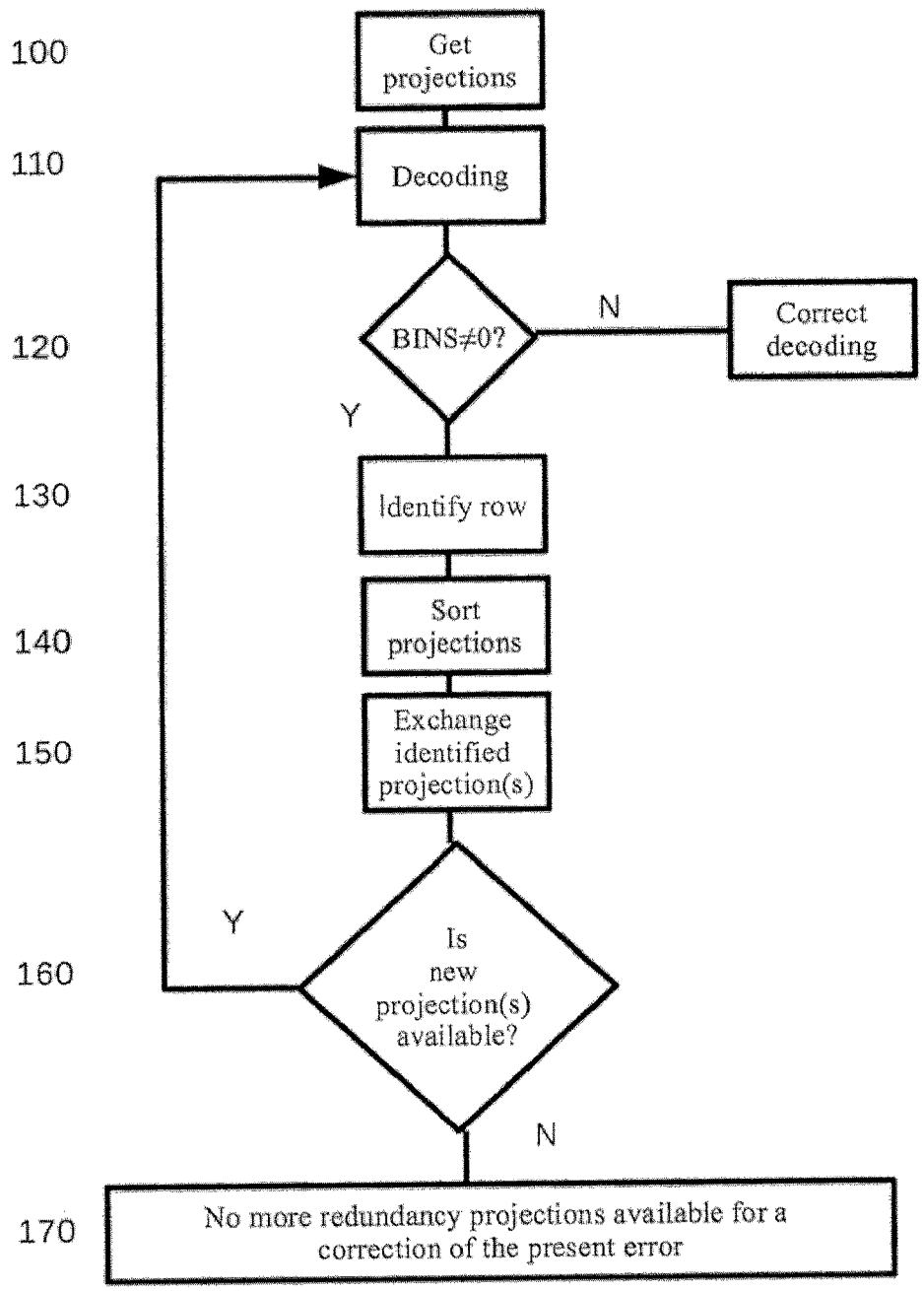
FIG. 1 is a flow diagram illustrating a method to identify Mojette transform projection(s) causing an error during data decoding together with DEADC and correction of the error, thereby leading to a correct decoding.

The present embodiments relate to a technology for error detection and correction of data during data reconstruction involving the use of a version of the exact Radon transform. The particular version is a discrete version referred to as a Mojette transform.

Storage servers today have large capacities to store data and the intense use of social and surveillance data boosts this need for high availability and distributed storage at low cost. Smaller devices, such as phones, smartphones, tablets and Internet of Things devices, IoT devices, also have a need for higher and higher performance when they generate more and more data to be transferred to stable storage in the cloud or into a private DC.

Data loss in any application is unacceptable and this drives the DC to secure the data by replication to other storages or DCs to, thereby, always have copies of the data. This makes it possible to reconstruct the data if data or storage is lost due to any type of circumstance. Replication is, however, suboptimal when handling large amount of data since all data has to be transferred and replicated in full if a node is lost. Replication also has the implication of having different versions of data on different storages, which makes the handling and maintenance very difficult and work intensive for the administrator. The amount of data in a replication environment is also normally a factor 3 to 7 times the original data due to the above needs for security and having the data distributed around the globe or between offices.

The introduction of erasure coding techniques, such as Reed-Solomon, has greatly improved the situation within DCs. In these situations replication is substituted by RAID, thereby reducing the need for storage capacity by a factor 3 to 5, resulting in cost, environmental, maintenance and safety benefits within the DCs. However, the Reed-Solomon type of erasure codes are not suited for distributed applications when the latency will have severe impact on the performance if one node fails in the RAID and communication with all other nodes over Internet is needed for the data reconstruction. Thus, for distributed storage applications, there is a need for an erasure code that is discrete and not Central Processing Unit (CPU) intensive for the client communicating with the backend storage.

The basic Mojette transform is well described in literature. In the following, the term "bin" is used to denote a projection element in a Mojette transform projection. Briefly, the Mojette transform is a linear discrete exact Radon transform, in other words a set of I discrete projections describing a discrete image f. Projection angles are chosen among discrete directions $\theta_i = \arctan(q_i/p_i)$, where $i \in I$ and such as $p_i$ and $q_i$ are integers primer together (GCD($p_i$, $q_i$)=1).

The paper by Pierre Verbert, Vincent Ricordel, Jean-Pierre Guédon. ANALYSIS OF MOJETTE TRANSFORM PROJECTIONS FOR AN EFFICIENT CODING. Workshop on Image Analysis for Multimedia Interactive Services (WIAMIS, April 2004, Lisboa, Portugal. 2004. <hal-00451338>) (Ref 1) provides an introduction into how direct and inverse (encode and decode) Mojette transform is done using the direct and inverse algorithms. One great advantage with these algorithms is that they use only addition and subtraction for the encoding and decoding operations, thereby minimizing the CPU constraints for the operations and making the application fast. The teachings of this paper is hereby incorporate by reference, and in particular the description of the Mojette transform in section 2, the selection of projections in section 3 and the selection of bins in section 4.

A paper by Nicolas Normand, Andrew Kingston, Pierre Évenou. A Geometry Driven Reconstruction Algorithm for the Mojette Transform. Attila Kuba, László G. Nyúl, Kálmán Palágyi. Discrete Geometry for Computer Imagery, October 2006, Szeged, Hungary. Springer Berlin/Heidelberg, 4245, pp. 122-133, Lecture Notes in Computer Science. <10.1007/11907350 11>. <hal-00267628> (Ref 2) teaches how to use a geometry driven decoding algorithm for the Mojette transform. The example for the projections (p,q) p1=(0,1), p2=(1,1), p3=(-1,1) shows that they are well suited for a basic Mojette configuration for storage purposes when this gives a minimum extra data for each calculated projection and has a simple reconstruction pathway. The teachings of this paper is hereby incorporated by reference in full, and in particular the description of Mojette transform in section 2 and the geometry driven reconstruction in section 3.

Even though the Mojette transformation operation is well described in the literature, see e.g. the above given references, we will provide the relevant definitions and some illustrating examples of the same in order to facilitate the understanding of the proposed technology. A Mojette transformation is a mathematical operation applied on a two-dimensional representation of data. As used herein it is applied on data blocks in order to obtain an efficient data storage representation of the data. A beneficial feature obtained by using the Mojette transform is that it only requires arithmetic operations in the form of additions and subtractions. This will reduce the computational demands of a CPU of a client that accesses data that has been stored in distributed storage.

As was mentioned earlier, the Mojette transform operator or the Mojette projection operator, is applied to a two-dimensional representation of data. Consider the fact that a two-dimensional array, having elements representing certain information carried by the data, can be represented by a discrete function f(k, l) where k and l denotes discrete elements of the array, e.g. pixels or samples. In a two dimensional array these denotes the columns and lines or rows, respectively.

The Mojette transform/projection operator is defined as:

$$M\{f(k,l)\} = \text{proj}(p_i, q_i, a) = \Sigma_{k=0}^{Q-1} \Sigma_{l=0}^{P-1} f(k,l) \delta(a + p_i l - q_i k)$$

The summation indices P and Q correspond to the size of the data block, i.e. the data is given a data block representation of size P×Q, a is a number that will specify the line over which the elements, or pixels, are centered. Applying the Mojette transform operator to a particular data block leads to a sum over the elements or pixels that are centered round a particular line $a = p_i l - q_i k$, where the particular line can be inferred from the Kronecker delta function $\delta(a)=1$, if $a=0$ and 0 otherwise. In what follows a will be removed from the argument in proj($p_i$, $q_i$, a) and a projection will simply be denoted by ($p_i$, $q_i$). The formula (1) above can be used to generate any projection with any value of p and q. The number B of line sums, i.e. the number of bins, per projection is given by $$B = (Q-1)|p| + (P-1)|q| + 1.$$

Examples of how these projections are obtained will be illustrated later in this application.

The proposed technology utilizes the described Mojette transform in order to obtain data representations that are suitable for distributed data storage. The data may however become corrupted during the transformation and there is therefore a need to be able to detect and also correct the corrupted data in order to obtain a secure, reliable and robust data storage. The proposed technology therefore provides a particular way whereby it will be possible to a) detect whether data has been corrupted, and b) correct the corrupted data in order to obtain a faithful representation of the data.

The proposed technology therefore provides a secure and robust data error detection and data correction mechanism which, when implemented by a client, also reduces the computational demands of the CPU of a client trying to extract the data from a data storage entity, e.g. a data storage server. To this end there is provided a method for performing data error detection and correction, see FIG. 12. The method comprises the step of providing S1 multiple Mojette transform projections ($p_i$,$q_i$) obtained by applying an encoding Mojette transform on an input, or original, block of data elements or values. The method also comprises the step of decoding S2 the multiple Mojette transform projections to form a reconstructed block of data elements or values. The method also comprises the step of investigating S3 whether any of the decoded Mojette transform projections comprises at least one bin≠0 following generation of the reconstructed block, thus providing an indication that a data error has been detected in the reconstructed block. The method also comprises the step of determining S4, if at least one bin≠0, a corrected reconstructed block of data elements or values based on the decoded Mojette transform projections.

In slightly different words, there is provided a method that detects erroneous data and, if such erroneous or corrupted data has been detected, also provide a way whereby the original data can be correctly reconstructed by utilizing Mojette projection. The method makes use of the Mojette transform which transforms an initial or original data block into multiple projections. The Mojette transformation may however equally well be seen as a particular way to encode the data block in order to provide a particular encoding of the original data block. To this end, the method takes as input specific data that has been given a representation that is suitable to encode by means of a Mojette transform, e.g. a data block representation. With data block is here intended a particular sequence of information, i.e. bytes or bits, having a particular size that is commonly denoted block size.

The data elements or values mentioned above forms part of the sequence of the data block. When the Mojette transform has been applied to the data block a number of projections are obtained. These projections furnish a particular representation of the original data. The method then proceeds and decodes the multiple Mojette transform projections in order to obtain a reconstructed version of the data block and decoded Mojette transform projections. The reconstructed, data block contains data elements also referred to as pixels herein. The decoded Mojette transform projections carries bins, i.e. the particular number valued elements that are contained in a particular Mojette projection, and the method proceeds by investigating these bins in order to determine whether any data error has been detected in the reconstructed data block, i.e. if any of the Mojette projections contains erroneous data. The particular test performed on the data is to check whether any of the decoded Mojette transform projections contains at least one bin that has a numerical value different from zero after the block has been reconstructed. Such a non-zero bin provides a clear indication that corrupt or erroneous data in the reconstructed block has been detected. If such a bin has been detected the method proceeds and create a corrected version of the data block based on the earlier decoded additional Mojette transform projections. In an embodiment, the method may also comprise the step of checking if all bins=0 after decoding for verifying correct decoding and/or data integrity.

In an embodiment, the method comprises obtaining projections using the Mojette transform with $q_i=1$ for $i \in I$, e.g. for connecting rows with projections. That is, there is provided an embodiment of the method wherein the step S1 of providing multiple Mojette transform projections $(p_i, q_i)$ comprises providing projections using the Mojette transform with $q_i=1$, in order to connect rows with projections.

According to another embodiment of the proposed technology there is provided a method wherein the step of investigating S3 whether any of said decoded Mojette transform projections comprises at least one bin≠0, comprises to investigate whether any of the decoded Mojette transform projections used when forming the reconstructed data block comprises at least one bin≠0.

A particular embodiment of the proposed technology provides a method wherein the step S3 of investigating whether at least one bin≠0 further comprises, if at least one such bin was detected, the step of identifying a row in the reconstructed block comprising an erroneous data element or value based on the at least one decoded Mojette transform projection comprising at least one bin≠0.

Figures 1, 2:
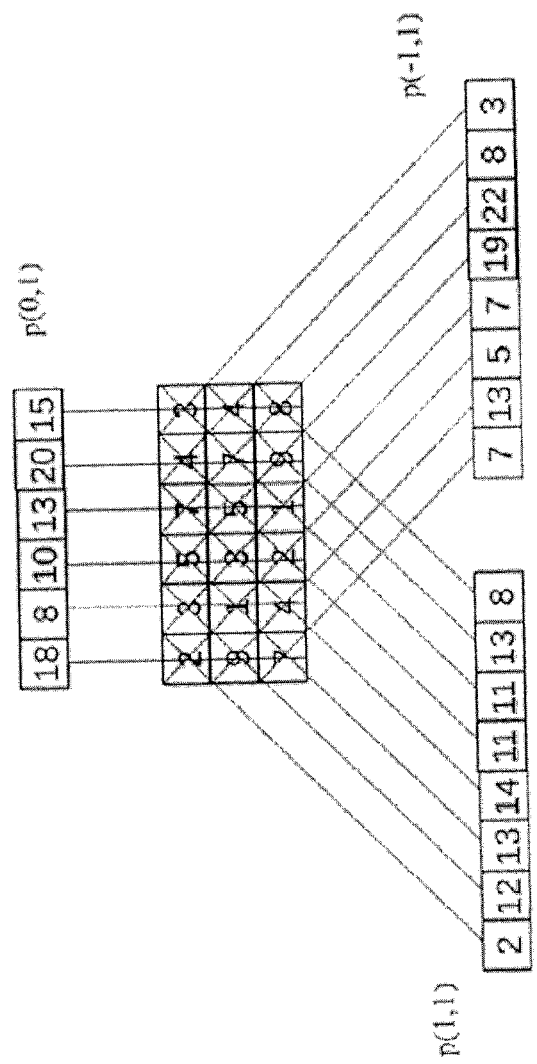
Figure 2:
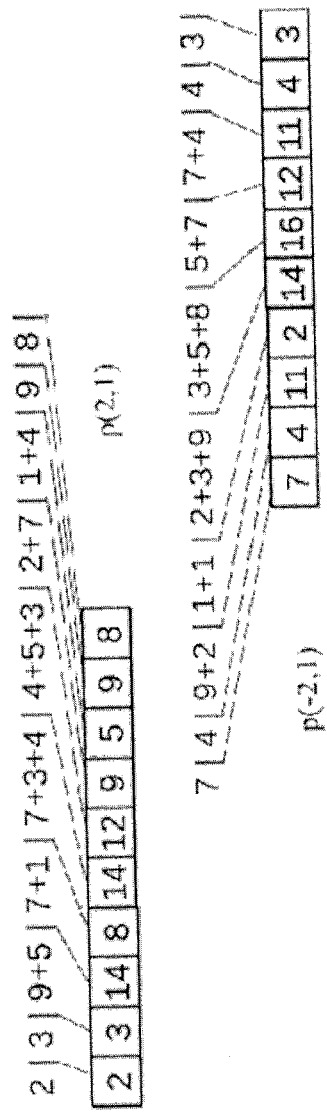

To illustrate how the proposed method acts to determine whether data has been corrupted, reference is made to an example illustrated in FIGS. 1, 2 and 4. This example illustrates how the method acts on an initial data block and perform the particular steps of the proposed method in order to determine whether data has been corrupted. It should be noted that the examples that follows are merely illustrative provided to facilitate the understanding of the proposed technology.

FIGS. 2-1, 2-2, and 2-3 illustrate executing full encoding of input or original data in the form of an exemplary input or original block with three rows of six pixels that will be Mojette transformed into five different projections. The top part of FIG. 2-1 illustrates the input block. Summation of pixels into bins, also referred to as projection elements in the art, is shown in FIG. 2-2. FIG. 2-3 illustrates the resulting five projections. All projections are chosen to have qi=1 to minimize the data size of the projections. The number of bins in a projection is determined by the block, i.e. by the size of the blocks in terms of number of rows and columns, and the projection angle. More information of the number of bins per projection can be found in Ref 2.

The detection of an error during data decoding, i.e. reconstructing a block from a number of projections, is shown in FIG. 1. Step S100 of FIG. 1 represents the retrieval of the projections to be used for the decoding of the block. In step 110 the decoding of the Mojette projections are carried out. This decoding can be carried out in a number of ways well described in literature, see in particular Ref 2. The decoding is also shown in more detail in FIG. 4 where it is illustrated an example of executing full decoding involving DEADC of the block encoded as shown in FIGS. 2-1, 2-2, and 2-3.

After decoding in step 110 in FIG. 1, step 120 comprises carrying out a check to verify if all bins are zero or not. One or more non-zero bins after the Mojette decoding indicates that one or many of the projections used in the decoding and reconstruction of the block contains an error. If on the other hand the verification shows that all projections are zero, i.e. empty, the decoding with the used projections has been successful and without errors and the result, i.e. reconstructed data, can be used for further processing. The data is in this case end-to-end verified for data integrity.

In an embodiment, the method comprises determining a common pixel for bins≠0 for the Mojette transform projections. In an embodiment, the method also comprises identifying the row connected to the common pixel for the Mojette transform projections having bins≠0. The proposed technology therefore provides an embodiment of a method wherein the step of identifying the row comprises identifying a pixel in the reconstructed block through which all of the at least one decoded Mojette transform projections, comprising at least one bin≠0, passes and identifying the row comprising the identified pixel. This is illustrated schematically in FIG. 5. To further illustrate this embodiment reference is made to FIG. 1 which provides an illustration of the case where an error was detected in step 120. Based on the fact that an error was detected, i.e. by noting that at least one bin was different from zero, the method continues to step 130 where an identification of the row(s) involved in cheating the error takes place. For each used projection, the non-zero bins are identified and the pixels building up the non-zero bin are identified and marked. From step 100 also the extra projection(s) for redundancy undergoes the same procedure to identify and mark bins≠0 after a subtraction from the resulting Mojette decoding result having the error. The pixel in a particular row $r_x$ having most projections pointing at this particular pixel indicates the row causing the error for the Mojette decoding.

Having illustrated how the method can be used to determine whether data has been corrupted and also how to obtain the location of the error by means of the decoded Mojette projections, below there will be illustrated how to determine a corrected reconstructed data block.

This particular purpose may be achieved by a particular embodiment of the proposed technology that provides a method as shown in FIG. 13 wherein the step S4 of determining a corrected reconstructed block comprises the further step of sorting S41 the decoded Mojette transform projections used in the generation of the reconstructed block based on a respective $p_i$ value of the decoded Mojette transform projections. The method also comprises the step of identifying S42 a decoded Mojette transform projection among the decoded Mojette transform projections associated with the identified row based on the sorting. The method also comprises the step of exchanging S43 the identified decoded Mojette transform projection with a redundant decoded Mojette transform projection. The method also comprises the step of determining S44 a corrected reconstructed block of data elements or values based on the decoded Mojette transform projections, wherein the identified Mojette transform projection is exchanged by the redundant decoded Mojette transform projection.

In slightly different words, according to this embodiment the method has already identified that at least one bin was non-zero. It has moreover also been determined where the particular error was located, i.e. the row, and possibly also the specific pixel, containing the error has been identified. The row has been found using information from at least two projections by solving the problem where these two projections intersect on a specific pixel, i.e. by solving the equation $a=p_t l-q_t k$, and on a specific row. Based on this information the method sorts the decoded Mojette transform projections according to their p value. The method also identifies a specific decoded Mojette transform projections associated with the identified row based on the sorting. In particular, If the set of projections are sorted by the values of p, i.e., $p0<p1< \ldots$, and reconstruction is performed on the data block from the left to the right, then row x of the data block, whose numerical values are provided by f(k, r), k being any integer value specifying the value of p, may be reconstructed by means of the Mojette projection, Proj ($p_x$, 1). This is further explained in Ref 2. As a particular example, consider the case with three Mojette transform projections, e.g. p(−2,1), p(2,1) and p(0,1). The method proceeds and sort these projections in the following order p(−2,1)<p(0,1)<p(2, 1) for the rows r0<r1<r2 of the data block. Accordingly, p(−2, 1)↔r0, p(0,1)↔r1 and p(2,1)↔r2. Hence if an error is carried by a specific row in the data block this can be mapped to a particular decoded Mojette projection, i.e. a particular projection is mapped to the row carrying the error. The method also comprises exchanging S43 the identified decoded Mojette transform projection with a redundant decoded Mojette transform projection. The redundant Mojette transform projection may be arbitrarily chosen among the multiple Mojette transform projections at hand since all projections carry redundant information that can be used to correctly reconstruct the data block. The method then determines a corrected reconstructed data block by exchanging the faulty Mojette transform projection with the redundant Mojette transform projection. It should be noted that the reconstructed data block, obtained by exchanging the fault carrying Mojette projection with a redundant projection, can be decoded again to ensure that the data block is correctly reconstructed by iterating the method using the reconstructed block as the original data block that will now be decoded S2 to determine whether there are any non-zero bins. If it is identified that there are no non-zero bins this is an indication that the decoding of the data block was correct. If non-zero bins were identified the method may then repeat the earlier described method and identify S42 the row and the pixel responsible for the error and use the decoded Mojette projections to reconstruct the data block by repeating the described steps, S41, S42, S43 and S44. This can be repeated until there are no redundancy projections left.

To illustrate this procedure, reference is made to an example illustrated in FIGS. 3, 4 and 5. In FIG. 3 an error is introduced in one of the projections in order to illustrate how the method (DEADC) will detect a data integrity problem in a projection during the decoding. The error is, in this example, introduced in projection p(2,1) bin no. 4 as shown by changing the bin value for the projection from 8 to 9. This type of error occurs randomly and are described in more detail in the paper Bernd Panzer-Steindel, Data integrity, CERN/IT Draft 1.3, Apr. 8, 2007 (Ref 3), the teaching of which is hereby incorporated as reference. Ref 3 discusses the critical impact of undetected data integrity problems Below there will be illustrated a particular embodiment of the proposed technology where a set, i.e. at least one, of the provided Mojette projections will be used when determining a corrected reconstructed data block and where at least one of the remaining projections will be used as redundancy projections. The particular projections to be used as redundancy projections may be chosen arbitrarily since all the projections carry information that can be used to reconstruct a corrected data block.

In the illustrated decoding example of FIG. 4, the projections p(2,1), p(−2,1), p(0,1) may be used to reconstruct the block and the data and the projections p(1,1), p(−1,1) may be used as redundancy projections. FIG. 4 shows one of many possible solutions of decoding or reconstructing the block using the three projections p(−2,1), p(2,1), p(0,1) to solve the Mojette transform employing a geometry driven reconstruction starting by placing out the single pixel bins. In FIG. 4, steps S1-S8 comprise placing out the bin values from the projections p(2,1) and p(−2,1) for those bins that only have values from a single pixel each (see FIG. 2-2). All these steps are marked to the right with a horizontal line. These single pixel bins are in this example four bins per projection and result in placing pixel values to the corners of the block. In these steps S1-S8, once a pixel value has been placed out from a projection, the corresponding bin is zeroed.

The decoding or reconstruction of the block can then continue using the other projection p(0,1) in steps S9-S11. These steps S9-S11 give the values for the remaining pixels in-between the pixels already placed in the previous steps S1-S8 by simply subtracting, step by step, the already placed out pixel values from the bin values in the projection p(0,1). Steps in FIG. 4 involving a calculation are marked on the right with a diamond.

The remaining pixels could then be calculated using projection p(2,1) by, step by step, subtracting the already placed pixel values from the respective bin and have the full block reconstructed in step S17 (marked with Finished at the right in FIG. 4).

The above described procedure of performing steps S1-S17 to reconstruct the block should merely be seen as an illustrative but non-limiting example of using the five projections from the encoding in FIG. 2-3 when reconstructing the block.

In steps S18-S20, the projections p(−2,1) p(0,1) and p(−1,1) are shown after the full reconstruction of the block is done and all pixels in the block have got an assigned value. These pixel values are then subtracted from respective bins in these projections resulting in the values as shown for steps S18-S20 in FIG. 4.

Thus, in FIG. 4 after step S17 the remaining projections are calculated to see if the bins are equal 0 or not. These following steps are the first DEADC steps performed to detect the error and later on correct the reconstruction of the block. First, the projections used for the decoding are calculated, i.e. p(2,1), p(−2,1), p(0,1). Then, if any bin is not equal zero a set or defined number of redundancy projections are called for and calculated to identify the pixel(s) having the wrong value. In this example, one redundancy projection p(−1,1) is called for and calculated together with the used projections p(2,1), p(−2,1), p(0,1). The number of redundancy projections to be used is determined by the need to uniquely determine the pixel(s) not having the correct value. If more than one projection having an error is used in the decoding of a block, then more redundancy projections are generally needed.

Below there will be provided an example that illustrates how to reconstruct a data block when the location, i.e. the row and possibly also the specific pixel, of the error has been identified.

In FIG. 5 the projections from FIG. 4 having non-zero bin(s) are geometrically illustrated and all pointing to pixel no. 4 in row 2 (r2). This indicates that the projection associated with solving of row 2 (r2) is responsible for introducing the error.

The method now aims to exchange the identified decoded Mojette transform projection with a redundant decoded Mojette transform projection.

In FIG. 5 the reconstructed block from FIG. 4 is shown together with lines representing the used projections p(−2,1), p(0,1) and the projection for redundancy p(−1,1). The projection p(2,1) gave only bin≠0 in step S17 FIG. 4. This projection does therefore not indicate any error and is not shown in FIG. 5. However, projections p(−2,1), p(0,1) and p(−1,1) all have a bin≠0 (see steps S18-S20 in FIG. 4) in the check performed in step 120 in FIG. 1. These projections therefore indicate that an error is present for these projections in the reconstructed block. The row comprising the error then needs to be identified in step 130 in FIG. 1. FIG. 5 shows the result of the row investigation. It is clear from the figure that all projections with a non-zero bin passes through pixel no. 4 in row 2 (r2), thereby marking this pixel as the cause of the error.

In an embodiment, the method comprises sorting the $p_i$ values of the Mojette transform projections $(p_i,1)$ from the lowest value to the highest value. The method also comprises connecting this to the rows in the Mojette transform. To illustrate this embodiment, note that by having set q=1 for the encoding and creation of projections using the Mojette transform, each row in the reconstructed block corresponds to a projection as further shown in Ref 2. Accordingly, the projections used to create the reconstructed block, i.e. p(−2,1), p(2,1) and p(0,1), can then be sorted in step 140 of FIG. 1 according to their p values resulting in the following order p(−2,1)<p(0,1)<p(2, 1) for the rows r0<r1<r2. Accordingly, p(−2, 1)↔r0, p(0,1)↔r1 and p(2,1)↔r2. Thus, in this example p(−2,1) solves the bottom row, p(0,1) the middle row and p(2,1) the top row. This indicates that projection p(2,1) responsible for solving row r2 is the cause of the error in this example. The sorting S41 of the p-values and the corresponding association to the rows of the Mojette transform together with the fact that the row carrying the error has been identified S42 will enable the method to exchange S43 the error-causing projection with a redundant projection. The redundant projection will then replace the error-causing projection in order to determine S44 a corrected reconstructed block of data elements or values. To illustrate this in more detail reference is made to FIGS. 1 and 3. In step 150, an action is taken to exchange the error-causing projection with a redundant projection. In the current example shown in FIG. 3, the projection p(−1,1) may be used as redundant projection and gives a decoding that is without errors, i.e. all bins are equal to zero after decoding. Having reconstructed the data block correctly by exchanging the fault carrying Mojette projection with a redundant projection the method may return to the initial steps of the method in order to determine whether the reconstructed block contains errors. The reconstructed block will now be decoded S2 to determine whether there are any non-zero bins. If it is identified that there are no non-zero bins this is an indication that the decoding of the data block was correct. If non-zero bins were identified the method will repeat the earlier described method and identify the row and the pixel responsible for the error and use the decoded Mojette projections to reconstruct the data block by repeating the described steps, S41, S42, S43 and S44. This can be repeated until there are no redundancy projections left.

This is illustrated schematically in the flow diagram of FIG. 1. In FIG. 1 step 160 illustrates that a test is made to identify whether a new projection is available or not. If the answer is positive a new decoding is made in step 110 and if the answer is negative no more redundancy projections are available and the error is not possible to solve as concluded in step 170. In such a case, the problem needs to be solved with a different technique since there is not enough information to solve the error using the proposed method (DEADC) or technique. This means that step 160 provides one or more redundancy projections that can be used to exchange the identified error-causing projection. If no such redundancy projections are available or an insufficient number of redundancy projections are available the method continues to step 170.

According to an optional embodiment the method could be supplemented with a Cyclic Redundancy Check, CRC, performed on the initial or original data block. By ensuring that the initial data block does not contain corrupted data the method whereby the data is subject to the Mojette transform to obtain multiple Mojette transform projections $(p_i,q_i)$ does need to be initiated. So a particular embodiment of the proposed technology also comprises to perform CRC on the initial data and only apply the Mojette transform on the data block if the CRC sum is correct. This will ensure that a client does not need to perform a Mojette decoding on the data if the data is corrupted together with the Mojette transform in order to determine whether data has been corrupted.

The present disclosure shows how a client, by using Mojette transform together with DEADC, can detect a data integrity problem in a very cost efficient way and then efficiently identify the projection(s) causing the error and exchange that/these projection(s). A DEADC functionally will greatly improve the Mojette transform since the client can then, without any additional data or information, detect and repair errors caused, for instance, during the communication of data between end nodes or during storage of the data.

The DEADC will create an end-to-end verification of the data, thereby eliminating any errors further up or down in the stack. The DEADC is a very efficient data integrity solution making it possible to run a scale out implementation using the Mojette transform FEC code for distributed storage solutions. This is possible without having CPU consuming check summing on every block but instead only checking that all bins are zero after decoding the projections. Further actions will only be necessary after detecting an error and not for every transaction "good" or "bad".

Standard checksum verifications can add a (CRC) like CRC-32(C). These addition checksums could also be implemented in certain environments where network and CPU usage is not that critical and can be used for improving operations even further. "An Analysis of Data Corruption in the Storage Stack", Lakshmi N. Bairavasundaram, Garth R. Goodson, Bianca Schroeder in FAST '08: 6th USENIX Conference on File and Storage Technologies, pages 223-238 (Ref 4) described this in detail together with risks of not having a correct end-to-end data integrity. The teachings of this paper is hereby incorporated by reference herein.

Embodiments as described herein can be used together with CRC and checksum verification.

The DEADC solution for data integrity can be implemented in several different ways for creating efficient scale-out storage solutions. One application is to use the DEADC to build a high performance distributed scale out storage solution for object storage. Using object storage protocols like Openstack Swift, Amazone S3, Rackspace, or other object storage protocols (SWIFT) this can be a scale out storage backend for a client to communicate and store data to either using the application layer communication or distributed as a file system. Such a file system could, for example, be Common Internet File System (CIFS), Network File System (NFS) or other, which can be further distributed or remain locally on the client, to be consumed as storage. There could also be a direct communication with the application handled over different client libraries to enable application support for other computer languages like PHP, Java, Ruby, Django.

It should be noted that the proposed technology also provides a method for performing data error detection. The method comprises the steps of providing, or retrieving, multiple Mojette transform projections $(p_i, q_i)$ obtained by applying a Mojette transform on an input, or original, block of data elements or values. The method also comprises the step of decoding the multiple Mojette transform projections to form a reconstructed block of data elements or values. The method also comprises the step of investigating whether any of the decoded Mojette transform projections comprises at least one bin≠0 following generation of the reconstructed block, thus providing an indication that a data error has been detected in the reconstructed block. This particular data error detection method acts to determine where the erroneous data is located. To correct the erroneous data this method may be supplemented with step S4 of determining a corrected reconstructed block of data elements or values based on the decoded Mojette transform projections. That is, it may be supplemented with the earlier described procedure for determining a corrected reconstructed block of data elements or values.

Having described the proposed method in great detail above, here will follow a description of a device that is suitable to implement the method. The same advantages that were described in relation to the method are equally valid here and will not be repeated. The proposed technology thereby provides a device configured to perform data error detection and correction. The device is configured to provide multiple Mojette transform projections $(p_i, q_i)$ obtained by applying a Mojette transform on an input, or original, block of data elements or values. The device is also configured to decode the multiple Mojette transform projections to form a reconstructed block of data elements or values. The device is also configured to investigate whether any of said decoded Mojette transform projections comprises at least one bin≠0 following generation of the reconstructed block, thus providing an indication that a data error has been detected in the reconstructed block. The device is configured to determine, if at least one bin≠0, a corrected reconstructed block of data elements or values based on the decoded Mojette transform projections.

A particular embodiment of the proposed technology provides a device that is configured to provide projections using the Mojette transform with $q_i=1$ in order to connect rows with projections.

Another embodiment of the proposed technology provides a device that is configured to investigate whether any of the decoded Mojette transform projections, used when forming the reconstructed data block, comprises at least one bin≠0.

Yet another embodiment of the proposed technology provides a device that is configured to, if least one bin≠0 was detected, identify a row in the reconstructed block comprising an erroneous data element or value based on the at least one decoded Mojette transform projection comprising at least one bin≠0.

Still another embodiment provides a device that is further configured to identify a pixel in said reconstructed block through which all of said at least one decoded Mojette transform projections, comprising at least one bin≠0, passes and identifying the row comprising the identified pixel.

A particular embodiment of the proposed technology provides a device that is configured to determine a corrected reconstructed block by being:

configured to sort the decoded Mojette transform projections used in the generation of the reconstructed block based on a respective $p_i$ value of the decoded Mojette transform projections;

configured to identify a decoded Mojette transform projection among the decoded Mojette transform projections associated with the identified row based on the sorting;

configured to exchange the identified decoded Mojette transform projection with a redundant decoded Mojette transform projection; and configured to determine a corrected reconstructed block of data elements or values based on the decoded Mojette transform projections, wherein the identified Mojette transform projection is exchanged by said redundant decoded Mojette transform projection.

By way of example, the proposed technology provides a device that is configured to sort the decoded Mojette transforms by being configured to sort the $p_i$ values of the Mojette transform projections $(p_i, q_i)$ from the lowest value to the highest value and connecting this to the rows in the Mojette transform.

Figure 15:
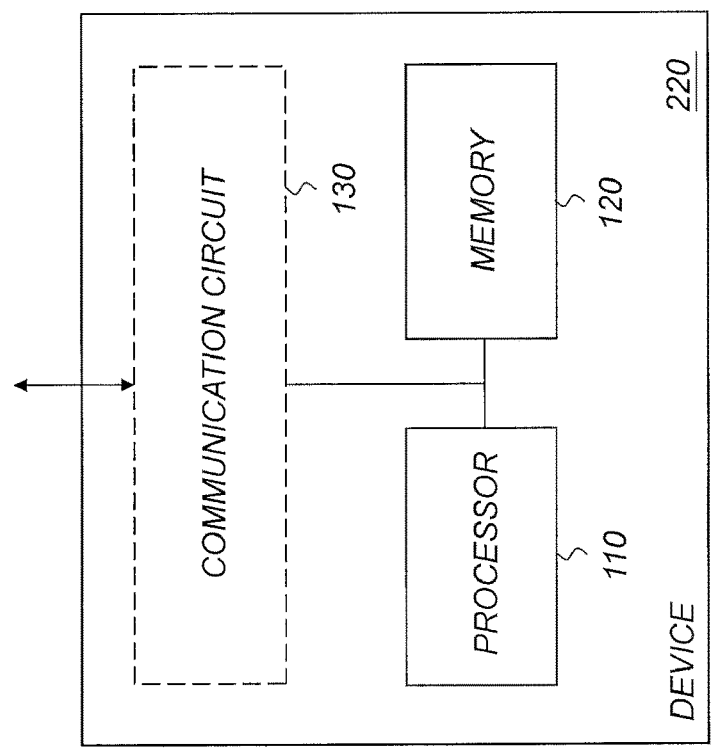
FIG. 15 is a schematic illustration of a device according to the proposed technology.

FIG. 15 provides a schematic block diagram illustrating a device 220 according to the proposed technology. The device 220 comprises a communication circuitry 130, a processor 110 and a memory 120, the memory 120 comprising instructions executable by the processor 110, whereby the processor 110 is operative to perform data error detection and correction, by:

providing multiple Mojette transform projections $(p_i, q_i)$ obtained by applying a Mojette transform on an input, or original, block of data elements or values;

decoding the multiple Mojette transform projections to form a reconstructed block of data elements or values;

investigating whether any of said decoded Mojette transform projections comprises at least one bin≠0 following generation of the reconstructed block, thus providing an indication that a data error has been detected in the reconstructed block;

determining, if at least one bin≠0, a corrected reconstructed block of data elements or values based on the decoded Mojette transform projections.

Figure 6:
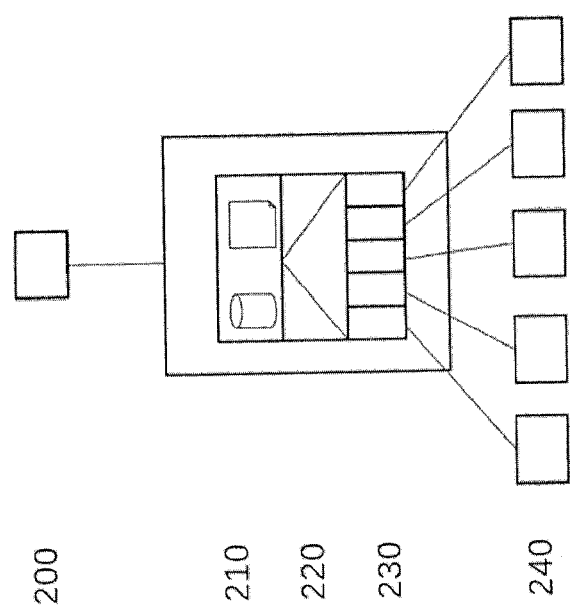
FIG. 6 illustrates an implementation of the Mojette transform and DEADC code into a distributed object storage. The configuration shows a client 200 of any Operative System (OS) or application that consumes storage 240 with an integrated application comprising many Openstack SWIFT servers 230 together with the Mojette transform DEADC code 220 for scaling out to the different SWIFT servers 230. On top of this a converter 210, converting from object storage to a file system or a combination of object storage and file system, is placed to support storage directly to the application on the client 200 or through a conventional file system like NFS or CIFS. The implementation could be based on a hypervisor platform of any kind, e.g. Docker or VMware, depending on needs of High Availability (HA), performance, simplicity.

FIG. 6 illustrates an implementation showing the delivery to a distributed object storage using SWIFT or S3 http(s) based protocols for communication over TCP/IP, LAN or WAN network over any type of network interface, such as WiFi or Ethernet. A client 200 is a consumer of data and could, for instance, be a server or separate workstation or small IoT device communicating either over SWIFT or is given a file protocol CIFS or NFS for access to the storage 240. A converter 210 is preferably used for conversion from object storage protocol to file system NFS/CIFS or other protocol. The conversion could also result in a combination of both object storage access and file storage access to have both possibilities depending on the client application. The Mojette FEC code including the DEADC functionality is represented by an entity denoted ZebFEC 220 herein. Zeb-FEC 220 handles the scale out functionality from the client 200 through the converter 210 and through SWIFT nodes 230 (communication nodes) to a number of storage servers 240, such as SWIFT or other storage nodes. Each storage server 240 will receive one projection and only host an encoded part of the total data block, making the communication highly effective and also secure. For instance, each storage server 240 represents one row in the block configuration for a Mojette transform encoding minus the number of redundancy nodes. The minimum number of projections is equal to the number of rows, giving no redundancy. The total number of projections represents the number of SWIFT nodes 230 necessary for storing the projections in a standard setup. The number of redundancy projections have an impact on how many failing nodes the storage can handle before a stop to read or write data happens.

Generally, the number of rows, the number of projections and redundancy are important parameters to consider during a configuration phase since they influence the cost, redundancy, performance and so on for the data transfer. For instance, assume a situation with three (N) storage servers 240 and one (R) storage server 240 for redundancy and a block size of 4 k (B). Then, the number of projections are N=3, the number of rows are N−R=2 and the number of pixels per row B/(N−R)=4096/2=2048. In this example only two projections are needed to solve the block leaving one projection to be used as redundancy projection in the case of detection of an error according to FIG. 1.

Figure 11:
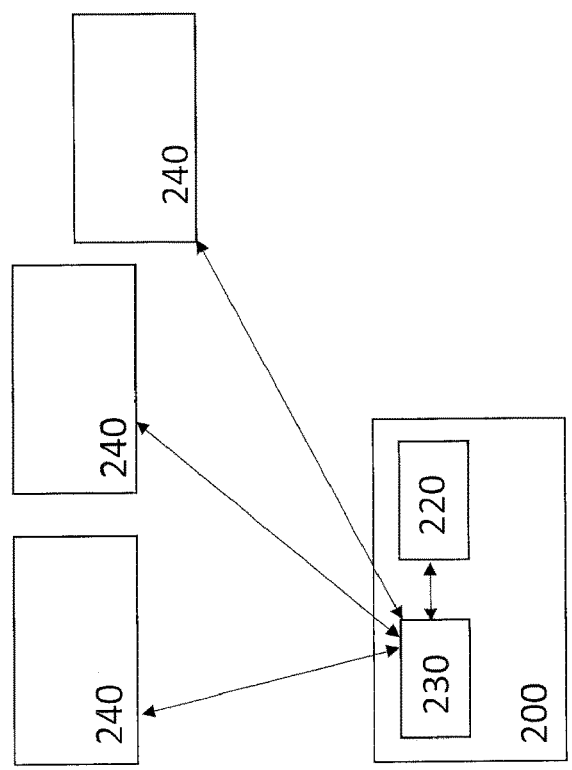
FIG. 11 is a schematic illustration of an object storage system according to the proposed technology.
Figure 16:
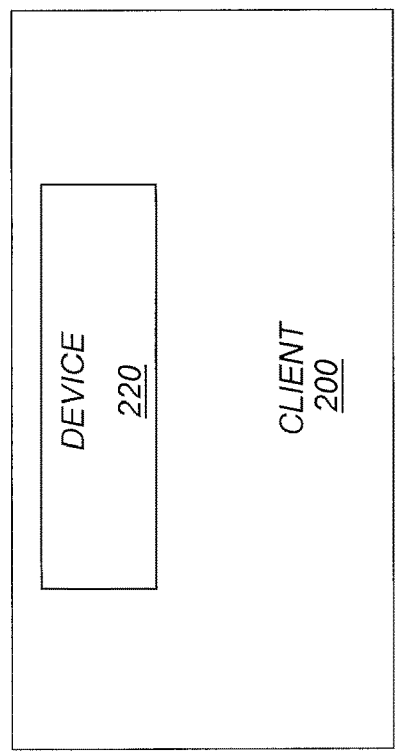
FIG. 16 is a schematic illustration of a storage consuming client incorporating a device according to the proposed technology.

The proposed technology also provides a distributed object storage system 20 comprising:

a plurality of storage servers 240 configured to store Mojette transform projections ($p_i, q_i$) obtained by applying an encoding Mojette transform on an input, or original, block of data elements or values;

a storage consuming client 200 configured to support communication over network interfaces, the client 200 comprising:

a plurality of communication nodes 230 for distributing a specific one of the Mojette transform projections ($p_i, q_i$) to a specific storage server 240. The client 200 further comprises a device 220 according to what has been described above. This is schematically illustrated in FIG. 11. A client 200 incorporating a device 220 according to the proposed technology is schematically illustrated in FIG. 16.

A preferred design for a client 200 may be to have a direct communication with the storage servers 240, which are preferably SWIFT communication capable. In such a case, a client application can be used for the communication over Internet to several storage servers 240. The client 200 will then comprise the client application, the converter 210, the device, also referred to as ZebFEC, 220 and SWIFT nodes or clients 230, preferably one for each projection. The SWIFT nodes 230 could also be in the form of a proxy server, handling distribution from a configuration file to a set number of storage servers 240. If an integrated client is configured in this way, the connection between the integrated client and the storage servers 240 will continuously be available with an end-to-end data integrity. Accordingly, redundant Mojette projections can be called for if one of the storage servers 240 are lost.

The SWIFT nodes 230 being accessed by the ZebFEC 220 can be located inside a DC or could be distributed in the cloud, depending on the needs of the application. The SWIFT nodes 230, if in a DC, would normally be connected to storage servers 240 over, for instance, iSCSI to take care of the final storage needs.

Figure 7:
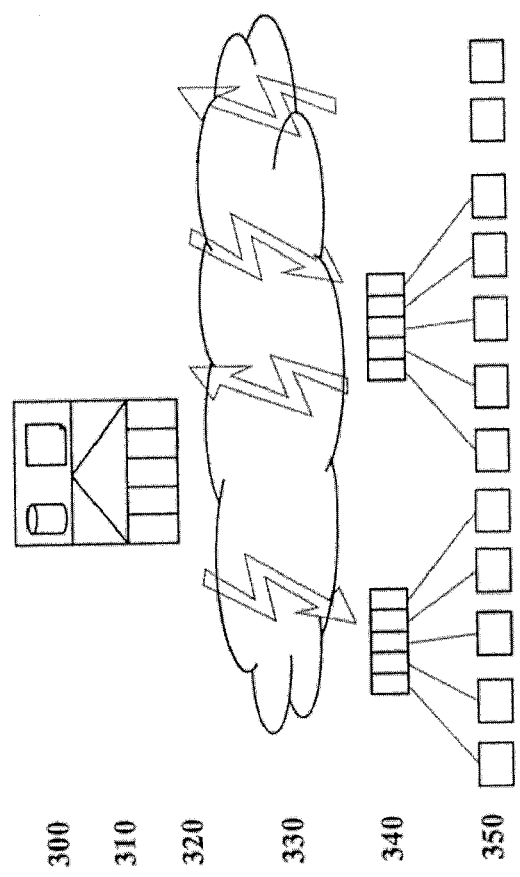
FIG. 7 illustrates a fully distributed client having Mojette transform and DEADC integrated together with SWIFT and communicating with many cloud storages nodes over Internet.

In FIG. 7 the client is a fully distributed client having both the Mojette transform and the DEADC (ZebFEC 310) and the converter 300 to file storage or object storage integrated in an image or application using SWIFT 320 for the communication. The communication to Internet 330 is done over SWIFT 320 and Internet to the SWIFT servers 340. The client will spread the projections over the SWIFT servers 340 to secure that the data is always redundant and safe. Distributing the projections also over all the continents will make the data available locally where the next consuming client is located. The client could be any computer in need of storage and communication. The communication over Internet 330 could also be async when enough redundancy is present in the number of projections. This will greatly speed up the communication over Internet and provide a high performance communication with the storage nodes 350.

The Mojette Transform together with DEADC can also be integrated into iSCSI or iSER communication to be used in DC for the communication between hosts and storage within the DC. This would bring scale out into the data center with a standard protocol that is used extensively within all DC for distributing storage.

Figure 8:
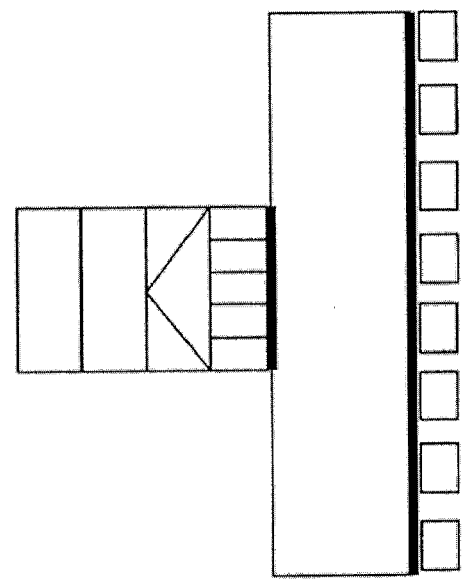
FIG. 8 presents a DC configuration for Mojette Transform with DEADC for Internet Small Computer Systems Interface (iSCSI) or iSCSI Extension for Remote Direct Memory Access (RDMA) (iSER) communication between clients and storage.

In FIG. 8 an iSCSI implementation 400 of the Mojette FEC including the DEADC is illustrated. This implementation represents the client or host computer communication over iSCSI Logical Unit Number (LUN) 410 to the Mojette transform including DEADC 420 encoding the communication as a number of projections and then again communicating this as many iSCSI initiators 430. The communication to the iSCSI targets 450 is made over a redundant network 440 within the DC and then further to the different iSCSI targets 450. Making an iSCSI scale out cluster will greatly improve the performance and create HA LUNs without extra software and features.

Figure 9:
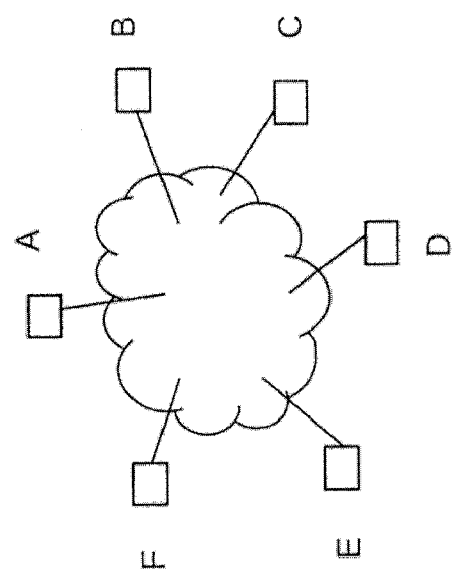
FIG. 9 presents a cluster of clients sharing a redundant storage, where each client acts as a storage and stores projection(s).

In FIG. 9 the use of Mojette transform together with the DEADC creates a cluster of nodes A-F sharing their memory or storage for creating a high available secure storage with built in data integrity. This makes it possible to have a local cluster of nodes A-F that communicates and shares the projections that later can be transferred to stable storage in a DC. This can happen at a set time or when an action is trigged. This will also be important for keeping the data safe in unsecure data communication situations, such that the projections are transferred to the DC when the communication with the DC is established. The nodes could be on a boat or in a car that sometimes is without Internet communication, but within the cluster communication is present. Sharing of hard disks in an office between local computers could be one way of using a set up shown in FIG. 9 to create a high available storage and/or data communication for certain applications. Each client A-F will hold a projection and if the number of rows in the block is less than the number of clients, this will make the communication of data redundant.

Figure 10:
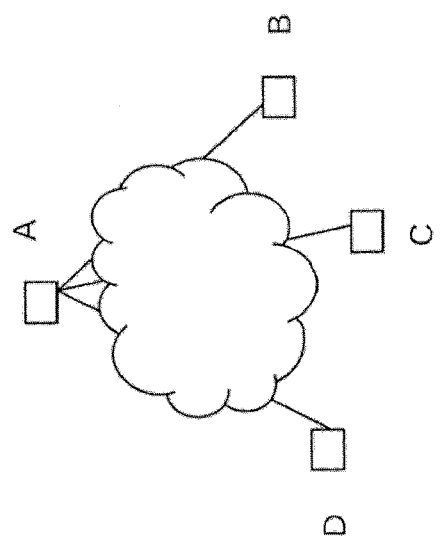
FIG. 10 illustrates a parallel network communication of projections from a number of nodes to a node in need of data having data integrity.

FIG. 10 describes an application on a node in need of data transfer for the application. This could then be a web site or any other application on node A that then fetches the projections from the closest nodes to build the data set. This data set is then transferred to the application for further processing. This will make a highly efficient way of distributing data to be consumed or handled for any type of application in need of a high available data communication or storage with client side data integrity build in. Node A is the client in need of data communication and B-D can be compute nodes, storage nodes, network nodes, or any type of application or communication enabler.

It is obvious that the DEADC check can be made in many different ways. It is generally preferred to check not only the projections used but also all redundancy nodes, on a regular basis to secure the data. One way is to have a scrubbing application to walk through the storage to secure data integrity. Another way is to handle the correction when it is detected or delay the correction to a specific time. All data error will be identified and logged for direct or delayed data error correction by the client or as a separate node application.

It is obvious that Mojette transform and DEADC is hardware and Operating System (OS) or data language agnostic and can be designed and introduced onto any computerized platform in need of data transfer and or storage.

An embodiment relates to a method for end-to-end data integrity detection and correction. The method comprises using the Mojette transform, as an illustrative example of an exact Radon transform, to achieve data error detection and data error correction. The method is in particular suitable for the use in high efficient data transfer and/or data storage.

In an embodiment, the method also comprises using CRC together with the Mojette transform. This embodiment thereby constitutes an efficient storage solution.

In an embodiment, the method is used with Openstack Swift, Amazone S3, Rackspace, or other object storage protocols (SWIFT).

In an embodiment, the method is used with or in a file system.

In an embodiment, the method is used with block storage protocols.

Embodiments also relates to clients, devices, apparatuses, systems, computer programs and computer program products implementing the embodiments, such as the above described method. Such clients, devices, apparatuses, computer programs and computer program products could be included in a single user client or in a data center, as non-limiting examples. In the latter case, the data center can deliver iSCSI or iSER to clients. It is also possible to create a local cluster sharing HA storages.

Embodiments can be implemented in software, hardware or a combination thereof. For instance, an embodiment comprises a processor and a memory. The memory comprises instructions executable by the processor. The processor is thereby operative or configured to perform the method and steps as described herein.

Figure 14:
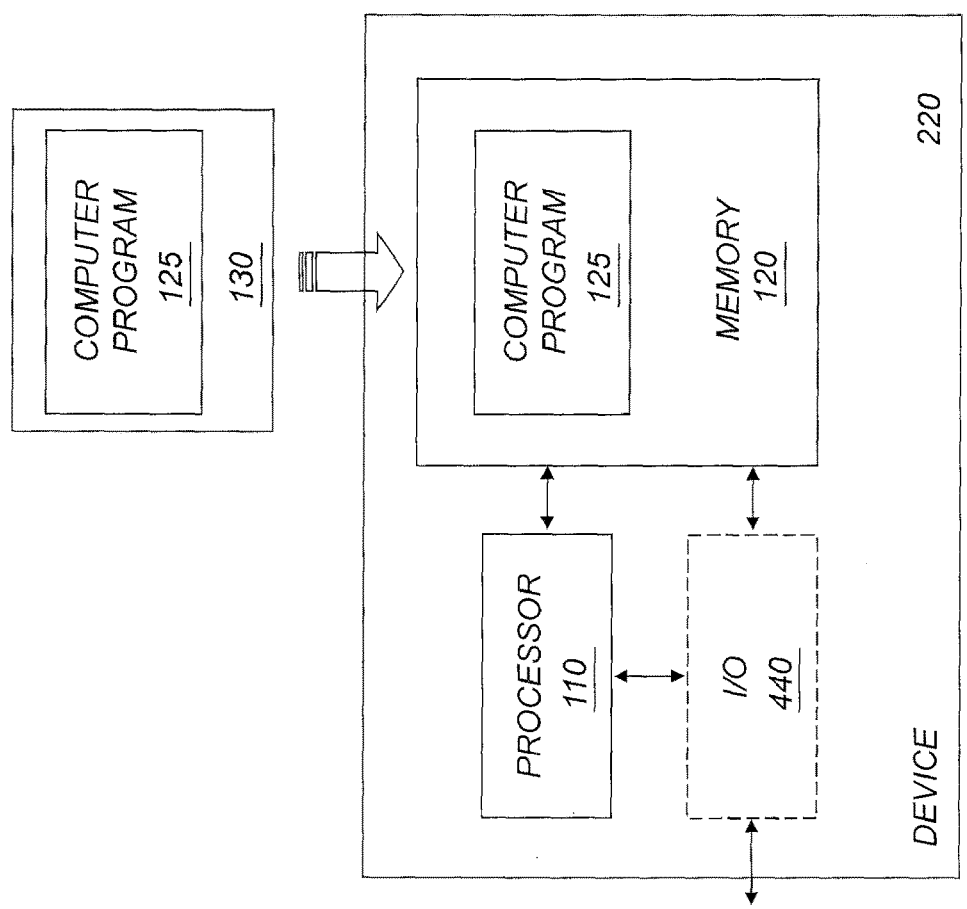
FIG. 14 is a schematic illustration of a computer implementation of the proposed technology.

A computer program according to the embodiments comprises instructions, which when executed by a processor, cause the processor to perform the method and steps as described herein. The proposed technology specifically provides, see the computer program implementation schematically illustrated in FIG. 14, a computer program 125 comprising instructions, which when executed by at least one processor 110, cause the at least one processor 110 to:

read multiple Mojette transform projections ($p_i, q_i$) obtained by applying a Mojette transform on an input, or original, block of data elements or values decode the multiple Mojette transform projections to form a reconstructed block of data elements or values and decoded Mojette transform projections;

investigate whether any of the decoded Mojette transform projections comprises at least one bin≠0 following generation of the reconstructed block, thus providing an indication that a data error has been detected in the reconstructed block; and creating, if at least one bin≠0, a corrected reconstructed block of data elements or values based on the decoded Mojette transform projections.

The proposed technology also provides a computer-program product comprising a computer-readable medium 120; 130 having stored thereon the computer program 125 described above.

A related embodiment defines a carrier comprising the computer program. The carrier is preferably one of an electronic signal, an optical signal, an electromagnetic signal, a magnetic signal, an electric signal, a radio signal, a microwave signal, or a computer-readable storage medium. The computer-readable medium is preferably a non-volatile computer-readable storage medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blue-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by a processor thereof.

It will be understood by those skilled in the art that various modifications and changes may be made to the present invention without departure from the scope thereof.

The invention claimed is:

1. A method for performing data error detection and correction in a distributed computing system, the method comprising:

providing multiple Mojette transform projections ($p_i, q_i$) obtained by applying an encoding Mojette transform on an original block of data element;

decoding said multiple Mojette transform projections to form a reconstructed block of data elements;

determining whether any of said decoded Mojette transform projections comprises at least one bin≠0 following generation of said reconstructed block, thus providing an indication that a data error has been detected in said reconstructed block; and determining, if at least one bin≠0, a corrected reconstructed block of data elements based on said decoded Mojette transform projections.

2. The method according to claim 1, wherein the step of providing multiple Mojette transform projections ($p_i, q_i$) comprises providing projections using said encoding Mojette transform with $q_i=1$.

3. The method according to claim 1, wherein the step of determining whether any of said decoded Mojette transform projections comprises at least one bin≠0, comprises determining whether any of said decoded Mojette transform projections used when forming said reconstructed data block comprises at least one bin≠0.

4. The method according to claim 1, wherein the step of determining whether at least one bin≠0 further comprises, if at least one such bin was detected, identifying a row in said reconstructed block comprising an erroneous data element or value based on said at least one decoded Mojette transform projection comprising at least one bin≠0.

5. The method according to claim 4, wherein the step of identifying said row comprises identifying a pixel in said reconstructed block through which all of said at least one decoded Mojette transform projections, comprising at least one bin≠0, passes and identifying said row comprising said identified pixel.

6. The method according to claim 4, wherein the step of determining a corrected reconstructed block comprises:
sorting said decoded Mojette transform projections used in the generation of the reconstructed block based on a respective $p_i$ value of said decoded Mojette transform projections;
identifying a decoded Mojette transform projection among said decoded Mojette transform projections associated with said identified row based on said sorting;
exchanging said identified decoded Mojette transform projection with a redundant decoded Mojette transform projection; and
determining a corrected reconstructed block of data elements based on said decoded Mojette transform projections, wherein said identified Mojette transform projection is exchanged by said redundant decoded Mojette transform projection.

7. The method according to claim 6, wherein the step of sorting said decoded Mojette transforms comprises sorting the $p_i$ values of the Mojette transform projections $(p_i, q_i)$ from the lowest value to the highest value and connecting this to the rows in said Mojette transform.

8. A device configured to perform data error detection and correction in a distributed computing system, wherein:
said device is configured to provide multiple Mojette transform projections $(p_i, q_i)$ obtained by applying an encoding Mojette transform on an original block of data elements;
said device is configured to decode said multiple Mojette transform projections to form a reconstructed block of data elements; and
said device is configured to determine whether any of said decoded Mojette transform projections comprises at least one bin≠0 following generation of said reconstructed block, thus providing an indication that a data error has been detected in said reconstructed block; and
the device is configured to determine, if at least one bin≠0, a corrected reconstructed block of data elements based on said decoded Mojette transform projections.

9. The device according to claim 8, wherein said device is configured to provide projections using said Mojette transform with $q_i=1$.

10. The device according to claim 8, wherein said device is configured to determine whether any of said decoded Mojette transform projections, used when forming said reconstructed data block, comprises at least one bin≠0.

11. The device according to claim 8, wherein said device is configured to, if least one such bin was detected, identify a row in said reconstructed block comprising an erroneous data element based on the at least one decoded Mojette transform projection comprising at least one bin≠0.

12. The device according to claim 11, wherein said device is further configured to identify a pixel in said reconstructed block through which all of said at least one decoded Mojette transform projections, comprising at least one bin≠0, passes and identifying said row comprising said identified pixel.

13. The device according to claim 8, wherein the device is configured to determine a corrected reconstructed block by being:
configured to sort said decoded Mojette transform projections used in the generation of said reconstructed block based on a respective $p_i$ value of said decoded Mojette transform projections;
configured to identify a decoded Mojette transform projection among said decoded Mojette transform projections associated with said identified row based on said sorting;
configured to exchange said identified decoded Mojette transform projection with a redundant decoded Mojette transform projection; and
configured to determine a corrected reconstructed block of data elements based on said decoded Mojette transform projections,
wherein said identified Mojette transform projection is exchanged by said redundant decoded Mojette transform projection.

14. The device according to claim 13, wherein said device is configured to sort said decoded Mojette transforms by being configured to sort the $p_i$ values of the Mojette transform projections $(p_i, q_i)$ from the lowest value to the highest value and connecting this to the rows in said Mojette transform.

15. A distributed object storage system comprising:
a plurality of storage servers configured to store Mojette transform projections $(p_i, q_i)$ obtained by applying a Mojette transform on an input, or original, block of data elements or values;
a storage consuming client configured to support communication over network interfaces, said client comprising:
a device according to claim 8; and
a plurality of communication nodes configured to distribute a specific one of said Mojette transform projections $(p_i, q_i)$ to a specific storage server.

16. A non-transitory computer-readable medium comprising instructions, which when executed by at least one processor, cause said at least one processor perform a method comprising:
reading multiple Mojette transform projections $(p_i, q_i)$ obtained by applying a Mojette transform on an original block of data elements
decoding said multiple Mojette transform projections to form a reconstructed block of data elements;
determining whether any of said decoded Mojette transform projections comprises at least one bin≠0 following generation of said reconstructed block, thus providing an indication that a data error has been detected in said reconstructed block; and
determining, if at least one bin≠0, a corrected reconstructed block of data elements based on said decoded Mojette transform projections.

* * * * *